(12) United States Patent
Nabki et al.

(10) Patent No.: US 8,071,411 B2
(45) Date of Patent: Dec. 6, 2011

(54) LOW TEMPERATURE CERAMIC MICROELECTROMECHANICAL STRUCTURES

(75) Inventors: Frederic Nabki, Longueil (CA);
Mourad El-Gamal, Brossard (CA);
Tomas A. Dusatko, Vancouver (CA);
Srikar Vengallatore, Montreal (CA)

(73) Assignee: The Royal Institution for the Advancement of Learning/McGill University, Montreal, Quebec (CA)

( * ) Notice: Subject to any disclaimer, the term of this patent is extended or adjusted under 35 U.S.C. 154(b) by 0 days.

(21) Appl. No.: 12/341,013

(22) Filed: Dec. 22, 2008

(65) Prior Publication Data
US 2009/0160040 A1 Jun. 25, 2009

Related U.S. Application Data

(60) Provisional application No. 61/008,579, filed on Dec. 21, 2007.

(51) Int. Cl.
*H01L 21/00* (2006.01)
(52) U.S. Cl. .......................... 438/50; 257/415
(58) Field of Classification Search .................. 257/415; 438/50
See application file for complete search history.

(56) References Cited

U.S. PATENT DOCUMENTS

| | | | |
|---|---|---|---|
| 5,062,798 A | 11/1991 | Tsuge et al. | |
| 5,937,275 A | 8/1999 | Munzel et al. | |
| 5,963,788 A * | 10/1999 | Barron et al. | 438/48 |
| 6,012,336 A * | 1/2000 | Eaton et al. | 73/754 |
| 6,746,891 B2 * | 6/2004 | Cunningham et al. | 438/52 |
| 6,762,094 B2 * | 7/2004 | Stasiak et al. | 438/257 |
| 6,770,569 B2 | 8/2004 | Foerstner et al. | |
| 6,916,717 B2 | 7/2005 | Li et al. | |
| 7,113,321 B2 * | 9/2006 | Nanjyo et al. | 359/290 |
| 7,160,752 B2 | 1/2007 | Ouellet et al. | |
| 7,326,629 B2 | 2/2008 | Nagarajan et al. | |
| 7,332,410 B2 | 2/2008 | Tong | |
| 2004/0262645 A1 | 12/2004 | Huff et al. | |

FOREIGN PATENT DOCUMENTS

WO 03089368 A2 10/2003

OTHER PUBLICATIONS

V.T. Srikar et al., "Materials Selection in Micromechanical Design: an Application of the Ashby Approach", Journal of Microelectromechanical Systems, vol. 12, No. 1, Feb. 2003.
S. Santavirta et al., "Biocompatibility of Silicon Carbide in Colony Formation Test in Vitro", Arch Orthop Trauma Surg, (1998), 118:89-91. Jing Wang et al., "1.51-GHz Nanocrystalline Diamond Micromechanical Disk Resonator with Material-Mismatched Isolating Support", IEEE, 17th Annual Conference on Micro Electro Mechanical Systems, 2004, pp. 641-644.
A. J. Rosenbloom et al., "Porous Silicon Carbide as a Membrane for Implantable Biosensors", Biomedical Microdevices, vol. 6, No. 4, Dec. 2004, Springer.
Nathan A. Dotson et al., "Low Cost MEMS Processing Techniques", Proceedings of the 2004 ASEE/NCS Spring Conference, Kalamazoo, MI, Apr. 1-3, 2004.
ISA/CA, "International Search Report", dated Apr. 7, 2009, pp. 1-4.

* cited by examiner

*Primary Examiner* — Jarrett Stark
*Assistant Examiner* — Nicholas Tobergte
(74) *Attorney, Agent, or Firm* — Freedman & Associates

(57) ABSTRACT

A method of providing microelectromechanical structures (MEMS) that are compatible with silicon CMOS electronics is provided. The method provides for processing and manufacturing is steps limiting a maximum exposure of an integrated circuit upon which the MEMS is manufactured during MEMS manufacturing to below a temperature wherein CMOS circuitry is adversely affected, for example below 400° C., and sometimes to below 300° C. or 250° C., thereby allowing direct manufacturing of the MEMS devices onto electronic integrated circuits, such as Si CMOS circuits.

23 Claims, 8 Drawing Sheets

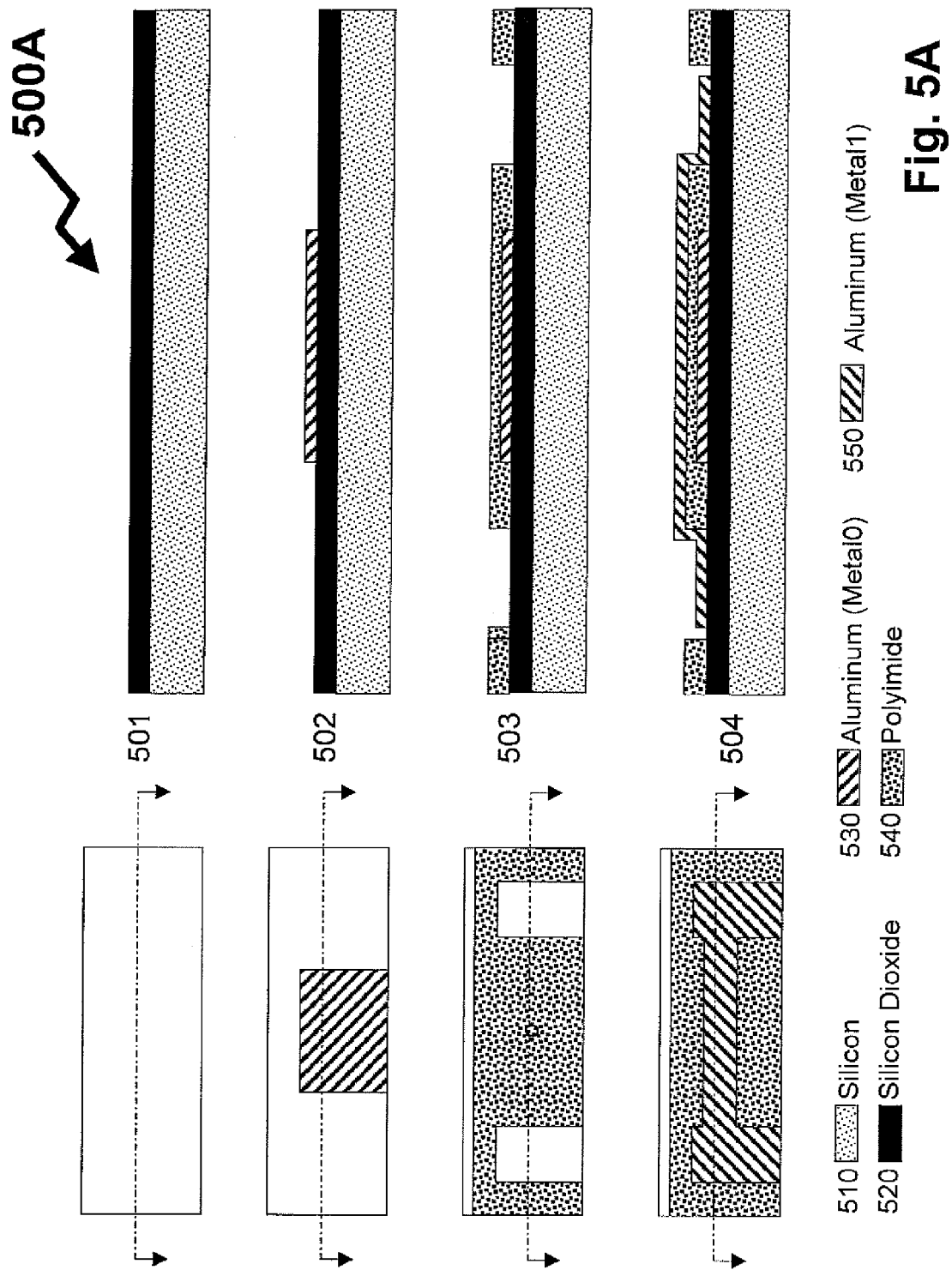

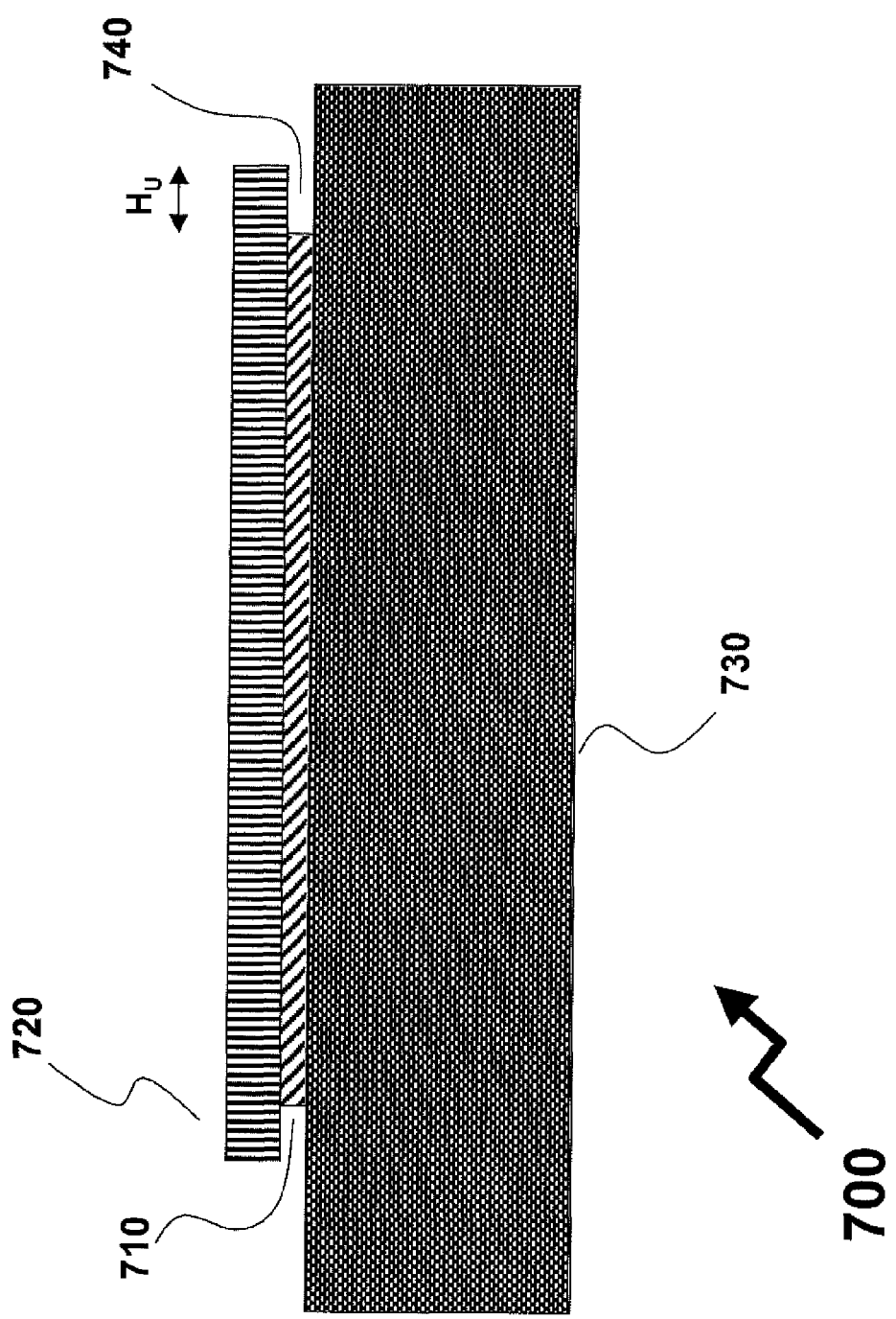

LOW TEMPERATURE CERAMIC MICROELECTROMECHANICAL STRUCTURES

FIELD OF THE INVENTION

The invention relates to manufacturing MEMS devices and more particularly to manufacturing and designing MEMS devices for integration directly with integrated electronic circuits.

BACKGROUND OF THE INVENTION

Microelectromechanical systems (MEMS) are small integrated devices or systems that combine electrical and mechanical components. The components can range in size from the sub-micrometer level to the millimeter level, and there can be any number, from one, to few, to potentially thousands or millions, in a particular system. Historically MEMS devices have leveraged and extended the fabrication techniques developed for the silicon integrated circuit industry, namely lithography, doping, deposition, etching, etc. to add mechanical elements such as beams, gears, diaphragms, and springs to silicon circuits either as discrete devices or in combination with integrated silicon electronics. Whilst the majority of development work has focused on silicon electronics additional benefits may be derived from integrating MEMS devices onto other existing electronics platforms such as silicon germanium (SiGe), gallium arsenide and, indium phosphide for RF circuits and future potential electronics platforms such as organic based electronics, nanocrystals, etc.

Examples of MEMS device application today include inkjet-printer cartridges, accelerometers, miniature robots, micro-engines, locks, inertial sensors, micro-drives, micro-mirrors, micro actuators, optical scanners, fluid pumps, transducers, chemical sensors, pressure sensors, and flow sensors. New applications are emerging as the existing technology is applied to the miniaturization and integration of conventional devices. These systems can sense, control, and activate mechanical processes on the micro scale, and function individually or in arrays to generate effects on the macro scale. The micro fabrication technology enables fabrication of large arrays of devices, which individually perform simple tasks, or in combination can accomplish complicated functions.

The MEMS market is currently projected to exceed US $10 Billion in 2011, doubling from its estimated 2005 revenues of $5 Billion, according to Semiconductor Partners (Phoenix) ("*Driving MEMS beyond Automotive*" September 2007). Whilst historically the automotive MEMS market has dominated and will still show robust growth as the number of MEMS devices per vehicle increases from an average of 40 per mid-range vehicle to ~60 MEMS for the same class of vehicle in 2011, it is the potential for growth in the consumer, communication and portable device markets that is more significant. Such applications include monolithic microphones and loudspeakers, oscillators, handheld controls for gaming devices and cellular telephones, hard disk drives, RF switches and ink-jet print heads. The MEMS mobile cellular telephone market alone is expected to exceed US $0.5 Billion in 2008 according to Research and Markets ("*Mems4Mobile 06: Updated Analysis of the Applications and Markets of MEMS in Mobile Communications*" February 2006). Such MEMS devices incorporated into cellular telephones potentially including silicon microphones, 3D accelerometers, gyroscopes for camera stabilization and GPS navigation, microfuel cells, personal weather stations, and biochips for health care monitoring.

MEMS have become a successful sensing and actuating technology. Because of their extensive optical, electrical to mechanical functionalities, MEMS devices are suited to applications in many different fields of science and engineering. However, because of this vast range of functionality, MEMS fabrication processes, unlike the microelectronics industry, are difficult to gear towards general applications. As a result most processes are aimed at the fabrication of a few devices, and usually performance of the devices is hindered by process variability. As MEMS devices are typically sensing weak analog signals, for example pressure, acceleration, vibration, magnetic or electric fields, with capacitive based elements, there is considerable benefit in being able to integrate analog front-end electronics to buffer, amplify and process these weak electronic signals and either facilitate their direct processing, such as with RF signals, or their digitization for sensing and measurements applications.

Historically CMOS electronics has become the predominant technology in analog and digital integrated circuits. This is essentially because of the unparalleled benefits available from CMOS in the areas of circuit size, operating speed, energy efficiency and manufacturing costs which continue to improve from the geometric downsizing that comes with every new generation of semiconductor manufacturing processes. In respect of MEMS systems, CMOS is particularly suited as CMOS circuits dissipate power predominantly during operation and have very low static power consumption. This power consumption arises from the charging and discharging of various load capacitances within the CMOS circuits, mostly gate and wire capacitance, but also transistor drain and transistor source capacitances, whenever they are switched. The charge moved is the capacitance multiplied by the voltage change. Multiply by the switching frequency to get the current used, and multiply by voltage again to get the characteristic switching power, P, dissipated by a CMOS device, and hence $$P=CV^2 f \qquad (1).$$

Historically, CMOS designs operated at supply voltages ($V_{dd}$) much larger than their threshold voltages ($V_{th}$), for example $V_{dd}$=5V and $V_{th}$=700 mV for both NMOS and PMOS. However, today CMOS manufacturers have adjusted designs and materials such that today an NMOS transistor may have a $V_{th}$ of 200 mV and allow operation from voltages as low as $V_d$=1V offering a significant power reduction which is important in sensing, mobile, chemical and biomedical applications.

However, combining CMOS and MEMS technologies has been especially challenging because some MEMS process steps—such as the use of special materials, the need for high temperature processing steps, the danger of contamination due to the MEMS wet etching processes etc.—are incompatible with the requirements of CMOS technology. Thus, strong attention has to be paid to avoid cross contaminations between both process families. Accordingly today MEMS processes exist that are discrete and standalone, such as Robert Bosch's (U.S. Pat. No. 5,937,275 "Method of Producing Acceleration Sensors", MEMSCAP's "Multi-User MEMS Processes" (MUMPs® including PolyMUMPs™, a three-layer polysilicon surface micromachining process: Metal-MUMPs™, an electroplated nickel process; and SOI-MUMPs™, a silicon-n-insulator micromachining process), and Sandia's Ultra-planar Multi-level MEMS Technology 5 (SUMMiT V™ Fabrication Process which is a five-layer polycrystalline silicon surface micromachining process with one ground plane/electrical interconnect layer and four mechanical layers).

Other processes have been developed to allow MEMS to be fabricated before the CMOS electronics, such as Analog Devices' MOD-MEMS (monolithically integrate thick (5-10 um) multilayer polysilicon MEMS structures with sub-micron CMOS), and Sandia's iMEMS. Finally, processes have been developed to provide MEMS after CMOS fabrication such as Sandia's micromechanics-last MEMS, Berkeley Sensor & Actuator Center (BSAC), and IMEC silicon-germanium processes. Additionally DALSA Semiconductor have a highly publicized "low temperature" micro-machining with silicon dioxide process, see L. Ouellet et al (U.S. Pat. No. 7,160,752 "Fabrication of Advanced Silicon-Based MEMS Devices", Issued Jan. 9, 2007) wherein low stress structures were fabricated at temperatures between 520° C. and 570° C., being just below the temperature of eutectic formation in aluminum-silicon-copper interconnections.

However, the mechanical properties of silicon do not make it the most suitable structural material for MEMS. Recently, silicon carbide (SiC) has generated much interest as a MEMS structural material because of its distinctive properties. SiC boasts better suited mechanical properties such as higher acoustic velocity, high fracture strength and desirable tribological properties. Its ability to sustain higher temperatures, and resist corrosive and erosive materials makes SiC, unlike silicon, a potential candidate material for use in harsh environments. SiC is also being investigated and shows promise as a biocompatible material, see for example "*Porous Silicon Carbide as a Membrane for Implantable Biosensors*" (A. J. Rosenbloom et al, Biomedical Microdevices, Vol. 6, No. 4, December 2004, Springer), "*Biocompatibility of Silicon Carbide in Colony Formation Test in Vitro*" (S. Santavirta et al, Archives of Orthopedic and Trauma Surgery, Vol. 118, Nos. 1-2, November 1998), and "*SiC Based Artificial Dental Implant*" (U.S. Pat. No. 5,062,798, K. Tsuge et al). These factors, along with the maturation of deposition and patterning techniques, make SiC a potential choice for high-performance MEMS processing.

However, difficulties with SiC processing have made its use non-trivial as it is non-conductive and difficult to deposit and dope at CMOS compatible temperatures. Stress control is also difficult because of the high intrinsic stresses that can develop in such a material. Because of its intrinsic inertness, selective etching of SiC is difficult. As most materials are etched at a faster rate than SiC, issues arise when masking SiC for patterning and ensuring a reliable etch-stop. Whether it is for doping or for deposition, SiC needs to generally be processed at high temperatures. As such prior art SiC MEMS processes have not lent themselves well to CMOS integration. Further as most MEMS applications require electrical signal processing, integration of MEMS to transistor-able processes, such as CMOS, is paramount.

It would be advantageous to overcome at least some of the disadvantages of the prior art.

SUMMARY OF THE INVENTION

In accordance with the invention there is provided a method comprising providing a substrate, and providing at least a low temperature deposited MEMS structure onto the substrate.

In accordance with another embodiment of the invention there is provided a method comprising: providing a substrate; and, performing a plurality of manufacturing steps comprising at least providing material onto the substrate and removing material therefrom, the plurality of manufacturing steps resulting in a MEMS structure being formed on the substrate, each of the plurality of steps performed with the substrate at a temperature sufficiently low so as to other than substantially adversely affect electronic circuitry formed within the substrate.

In accordance with an embodiment, the conductive port of the MEMS structure is electrically coupled to at least an electronic circuit within the electronic circuitry.

In accordance with an embodiment, the non-conductive structural layer of the MEMS structure provides isolation of electrical contacts formed on the non-conductive structural layer.

In accordance with an embodiment of the invention there is provided a method comprising: (a) providing a substrate comprising electronic components at least partially within the substrate; (b) providing at least one lower metallization; (c) providing at least a sacrificial layer; (d) providing at least one middle metallization; (e) providing a structural layer; (f) providing at least one upper metallization; and (g) removing the at least one sacrificial layer.

In accordance with an embodiment, executing (b) through (g) results in a maximum upper temperature of the substrate being less than 351° C.

In accordance with an embodiment of the invention there is provided a method of manufacturing an integrated component comprising: providing a substrate; and, performing a plurality of manufacturing steps comprising at least providing material onto the substrate and removing material therefrom, the plurality of manufacturing steps resulting in a MEMS structure being formed on the substrate, each of the plurality of steps performed with a predetermined portion of the substrate at a temperature below 400 degrees Celsius.

In accordance with another embodiment of the invention there is provided a method comprising: providing a protective coating on an electronic integrated circuit, the protective coating formed by sputtering.

In accordance with another embodiment of the invention there is provided a method comprising: providing a protective coating on an electronic integrated circuit, the protective coating formed of SiC.

In accordance with another embodiment of the invention there is provided a method comprising: providing a protective coating on an electronic integrated circuit, the protective coating formed while maintaining a temperature of the IC below a temperature at which the electronic circuitry is substantially affected.

BRIEF DESCRIPTION OF THE DRAWINGS

Exemplary embodiments of the invention will now be described in conjunction with the following drawings, in which:

FIGS. 5A and 5B illustrate an embodiment of the invention in respect of a process flow to providing MEMS SiC on Si CMOS;

FIG. 7 illustrates a novel bimetallic mask for the etching of SiC.

DETAILED DESCRIPTION OF EMBODIMENTS OF THE INVENTION

Figure 1:
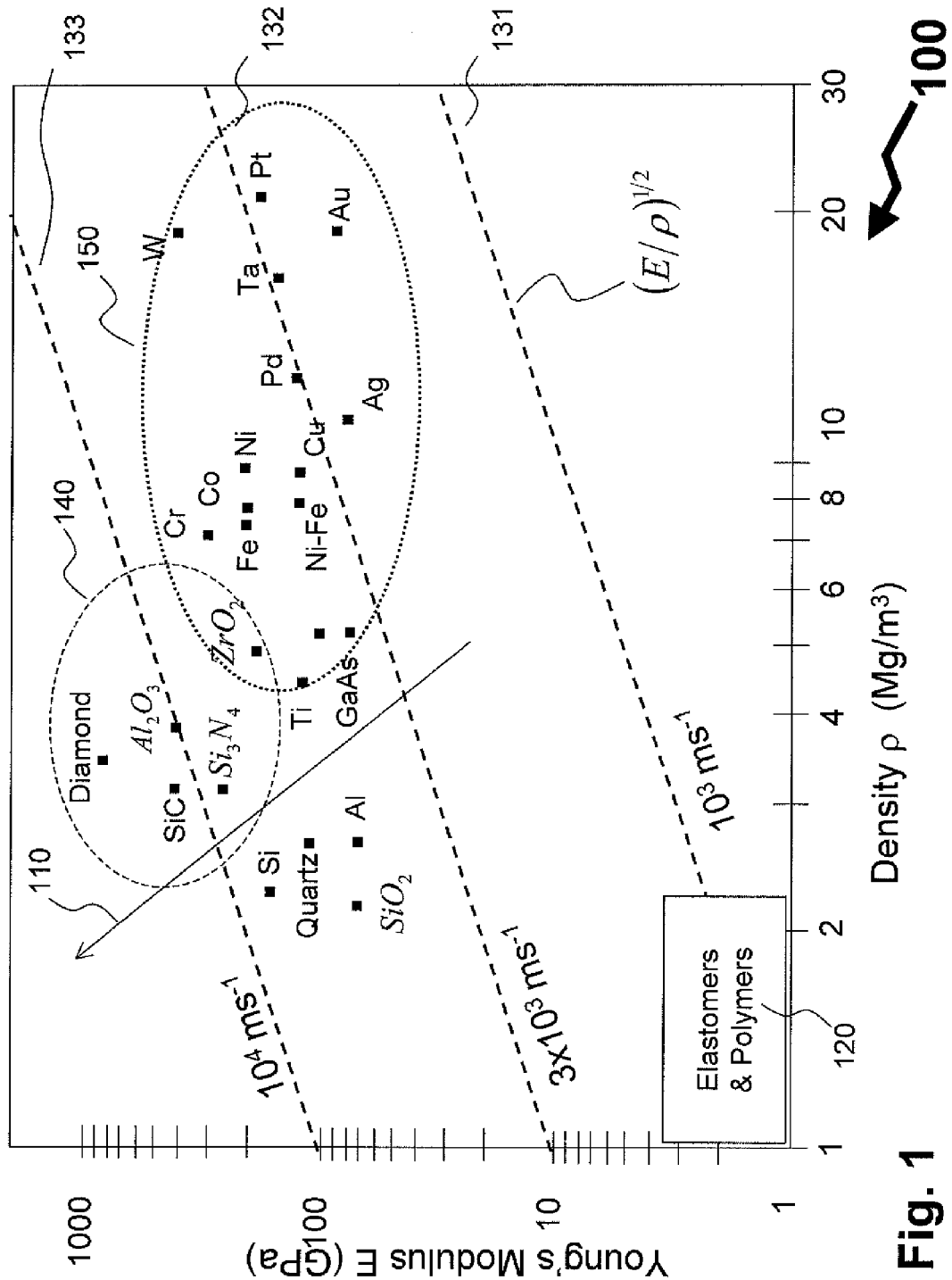
FIG. 1 illustrates the benefits of SiC for MEMS device implementations over Si.

Referring to FIG. 1 shown is a material selection chart 100 for MEMS device implementations. Plotted onto the material selection chart are a range of different materials including metals, dielectrics, ceramics and polymers. Each material is represented by a point on the X-Y graph wherein the X-axis is density and Young's modulus is the Y-axis. The data plotted is according to the work of V. T. Srikar et al "Materials Selection in Micro-Mechanical Design: An Application of the Ashby Approach" (J. Microelectromechanical Systems Vol. 10, No. 1, pp. 3-10). As acoustic velocity, a factor governing the resonant frequency of structural materials, is determined in accordance to Equation 2 below; shown are lines of constant acoustic velocity 131, 132, 133 of $1\times10^3$ ms$^{-1}$, $3\times10^3$ ms$^{-1}$, and $1\times10^4$ ms$^{-1}$ respectively.

$$v = \sqrt{\frac{E}{\rho}}. \tag{2}$$

As is evident from the material selection chart, different types of materials tend to be grouped together. Ceramic materials 140 tend to appear in the top left, metals 150 appear in the middle-right, whilst polymers and elastomers 120 are grouped together in the bottom-left. The trend arrow 110 indicates the direction of preference for selecting materials for MEMS application in having high Young's modulus and low density. Accordingly, from material selection chart 100 better alternatives to silicon (Si) would be silicon carbide (SiC), alumina (Al2O3) or diamond (C). Of these three, SiC represents an interesting choice as processing technology it requires is relatively mature. Although great strides are being made in developing nano-crystalline diamond for microsystem design, see for example J. Wang et al "1.51 GHz nano-Crystalline Diamond Micromechanical Disk Resonator with Material Mismatched Isolating Support" (IEEE 17$^{th}$ Annual Conf. on Micro Electro Mechanical Systems, 2004, pp. 641-644), the technology is still not widely available.

Figure 2:
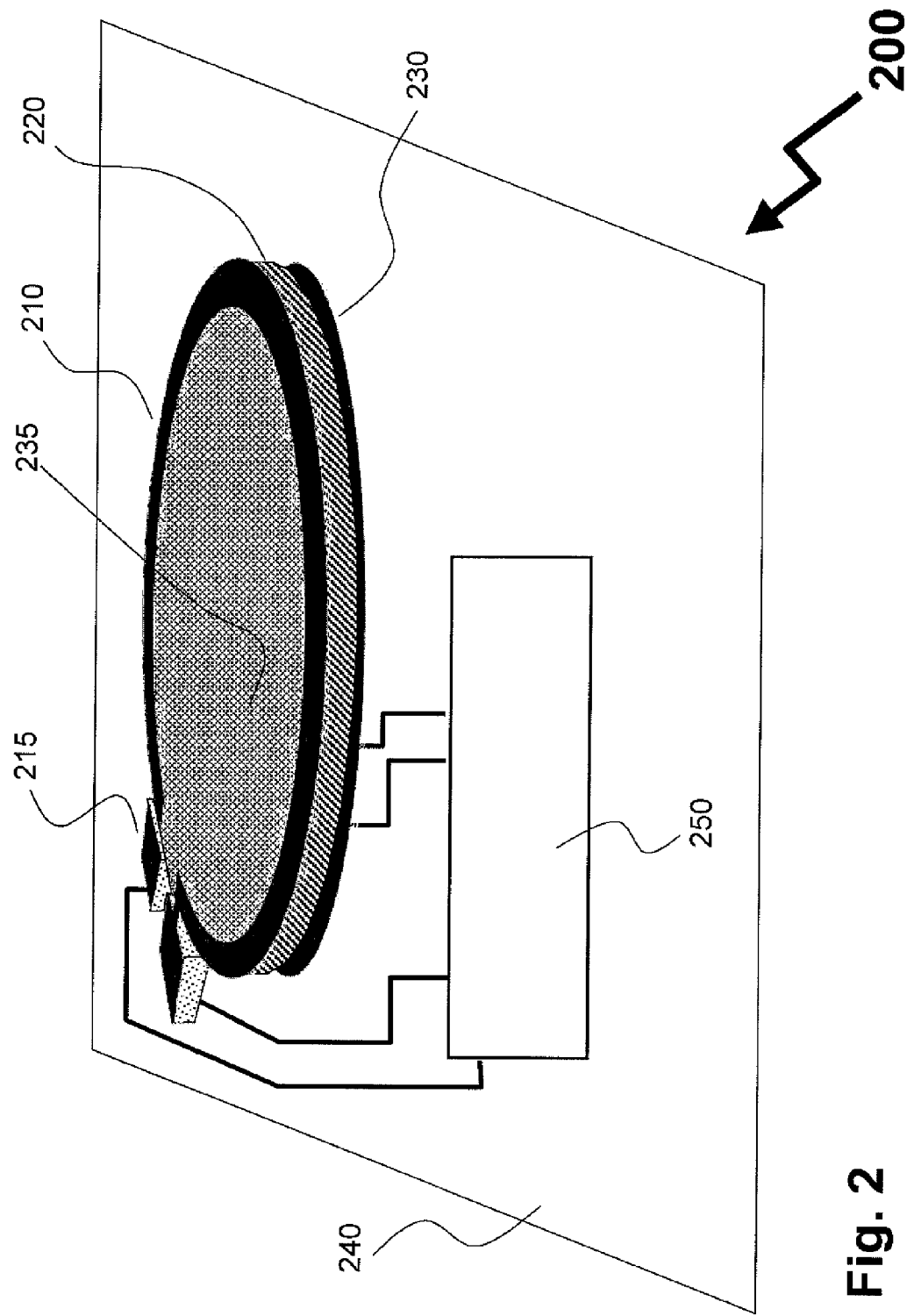
FIG. 2 illustrates an embodiment of the invention to form a MEMS inductor.

FIG. 2 illustrates an embodiment of the invention of MEMS-CMOS inductor 200 wherein a MEMS inductor is implemented upon a CMOS chip 240. As shown a CMOS chip 240 has formed upon it a MEMS inductor comprising bottom conductor 230, structural layer 220, and top conductor 210. The top conductor 210 has two electrical contacts 215, which are interfaced to analog CMOS circuit 250 provided within the CMOS chip 240. Similarly bottom conductor 230 comprises two electrical contacts 235 which are electrically interconnected to analog CMOS circuit 250.

It will be evident therefore that the low-temperature CMOS-compatible flow according to an embodiment of the invention allows for deposition of metal, bottom conductor 230, before the structural layer 220 and hence provides the ability to route signals both on top and on the bottom of the electrically insulating structural layer. This added degree of signal routing freedom yields interesting design advantages. For example, it is possible for electrical isolation of simultaneous signals in a MEMS device such as the MEMS inductor of MEMS-CMOS 200 in FIG. 2. The possibility of isolating signals between two different metallization levels on the structural layer rendered possible by this process, though it is impossible when prior art conductive structural layers are used. If the structural layer is conductive, the electrical potential of a device can only be set to one value and this may limit or constrain design freedom. However, through the non-conductive structural layer, signals may be isolated on the same side of the structural layer.

This process according to an embodiment of the invention allows the MEMS device to be added to the MEMS-CMOS 200 at the fully processed CMOS wafer. Such post-CMOS MEMS processing imposes stringent requirements on the processing steps used to fabricate the MEMS devices. These requirements pertain primarily to destruction of electrical interconnect performance due to diffusion, agglomeration, spiking or dopant deactivation. Such issues are becoming increasingly important in sub-micron CMOS technologies due to junction depth decrease and interconnect size reduction. It is generally understood that CMOS compatibility implies processes follow some guidelines, see for example N. Dotson et al "Low Cost MEMS Processing Techniques" (Proc. ASEE/NCS Spring Conference, Kalamazoo Mich. (USA), April 2004). Most importantly, all processing steps are undertaken at temperatures which are below 400° C. to prevent metallization and diffusion failures. This is a stringent temperature limit in conventional polysilicon-based MEMS processes. These rely on chemical vapor deposition (CVD) techniques which usually require high deposition temperatures for deposition of thick polycrystalline coatings. In addition, these deposition methods do not allow for stress control, and high temperature annealing is often necessary to reduce intrinsic stresses or enable electrical properties through doping. Such high processing temperatures are not only CMOS incompatible, but hinder process performance as they prohibit any pre-structural layer metallization. As a result, even if deposition temperatures are reduced by plasma enhanced chemical vapor deposition (PECVD) techniques; elevated temperatures are often still required to relieve intrinsic stresses and allow doping of the structural layer for good electrical operation. Hence, prior art MEMS processes that rely on polysilicon structural layers are inherently CMOS incompatible. The embodiments of the invention in contrast include providing a low temperature stress controlled deposition technique for facilitating CMOS integration and further providing for versatility of this process.

Additional requirements on MEMS integration include contamination of the CMOS wafers which is preferably minimized through careful planning of processing steps such as etching. CMOS wafers are preferably well protected from MEMS processing while allowing for an efficient interconnect to be fabricated. Most of these requirements are non-trivial but attainable if the MEMS process uses standard CMOS-compatible wet etching solutions and dry etching etch stops as provided by embodiments of the invention.

Figure 3A:
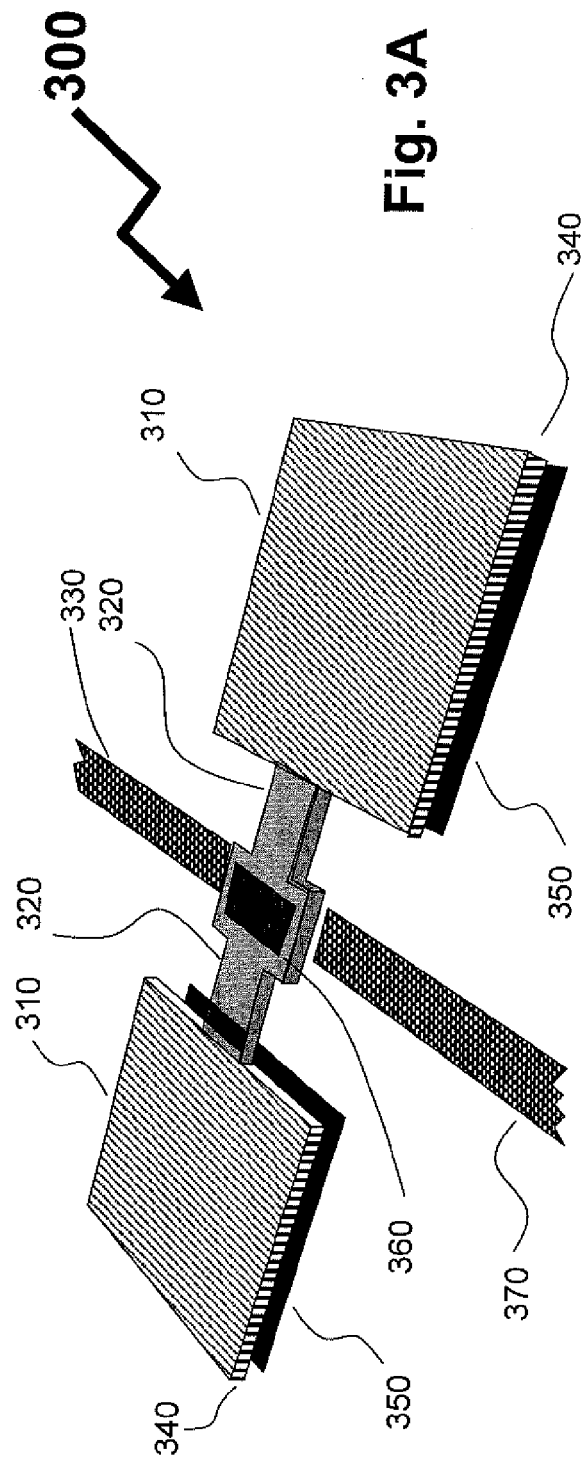
FIG. 3 illustrates an embodiment of the invention to form a MEMS RF switch.

Referring to FIG. 3A illustrated is a MEMS RF switch 300 according an embodiment of the invention. The MEMS RF switch 300 exploits the non-conductive structural layer such that signals are isolatable on the same side of the structural layer. As shown, the MEMS RF switch 300 comprises an input microwave signal line 370 and an output microwave signal line 330 which are discontinuous. The switch contact 360 is formed on the underside of the contact flexure 320 that is formed from the structural layer material 340. The small bridge of the contact flexure 320 is supported at each side by capacitive actuators formed from upper metal contact 310, lower metal contact 350 separated by the structural layer material 340. Upper metal contact 310 is actually formed on the lower side of the structural layer material 340 as is switch contact 360 and is electrically isolated due to the properties of the structural layer material 340, namely an insulator. This allows for electrical isolation of the microwave signal with respect to the actuation voltage required by the switch.

Hence, application of appropriate control signals to the upper metal contacts 310 and lower metal contacts 350 provides for capacitive actuation. However, in capacitive actuation "pull-in" may occur to cause a shorting of the actuation electrodes defined by upper metal contact 310 and lower metal contact 350. In order to prevent this, an exemplary process flow for an embodiment of the invention to provide the MEMS RF switch 300 includes the use of a spin-on glass (SOG) dielectric layer added to cover the lower metal contact 350. The SOG dielectric layer acts as a DC block in the event of "pull-in" but allows RF signals to propagate from the input microwave signal line 370 to the output microwave signal line 330 via switch contact 360.

Figure 3B:
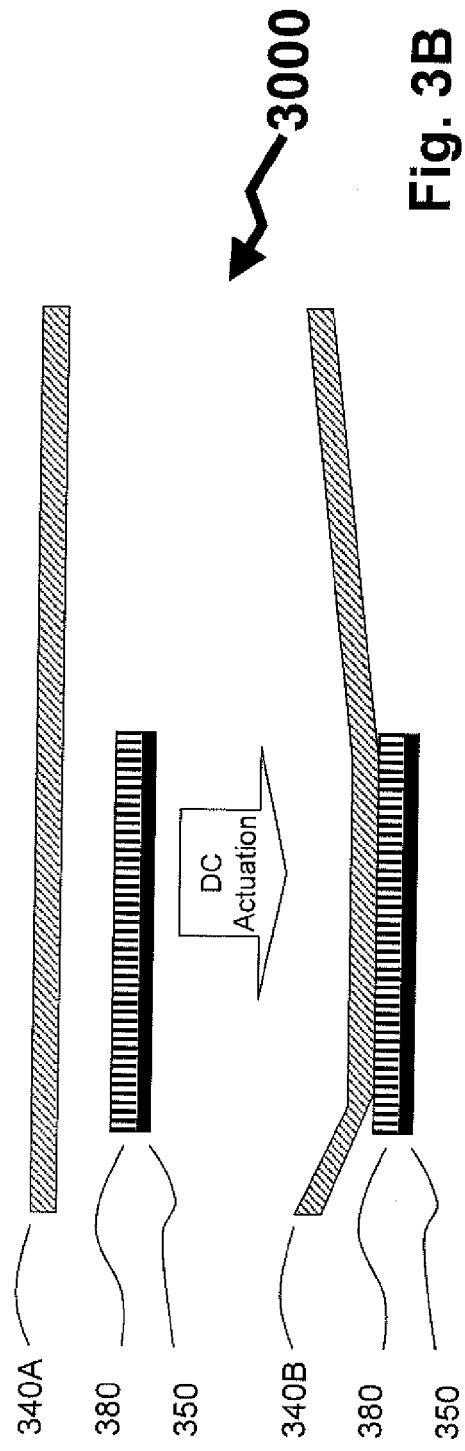

This configuration is shown in FIG. 3B for actuated/non-actuated cross-section profile 3000. Accordingly, in the upper portion of actuated/non-actuated cross-section profile 3000 the non-actuated profile shows the structural layer 340A without deformation along with the SOG layer 380 providing electrical isolation to the lower contact 350. The lower portion of actuated/non-actuated cross-section profile 3000 shows an occurrence of "pull-in" wherein the structural layer 340B has deformed and is now in contact with the SOG layer 380.

In typical CMOS integration flows, the process can be set atop of standard passivation or planarization layers such as phosphosilicate glass, silicon oxide, or nitride, and as such, in embodiments described subsequently, substrate passivation may be explicitly described as part of the MEMS integration process but may be added without changing the basis of the embodiments of the invention.

Figure 4:
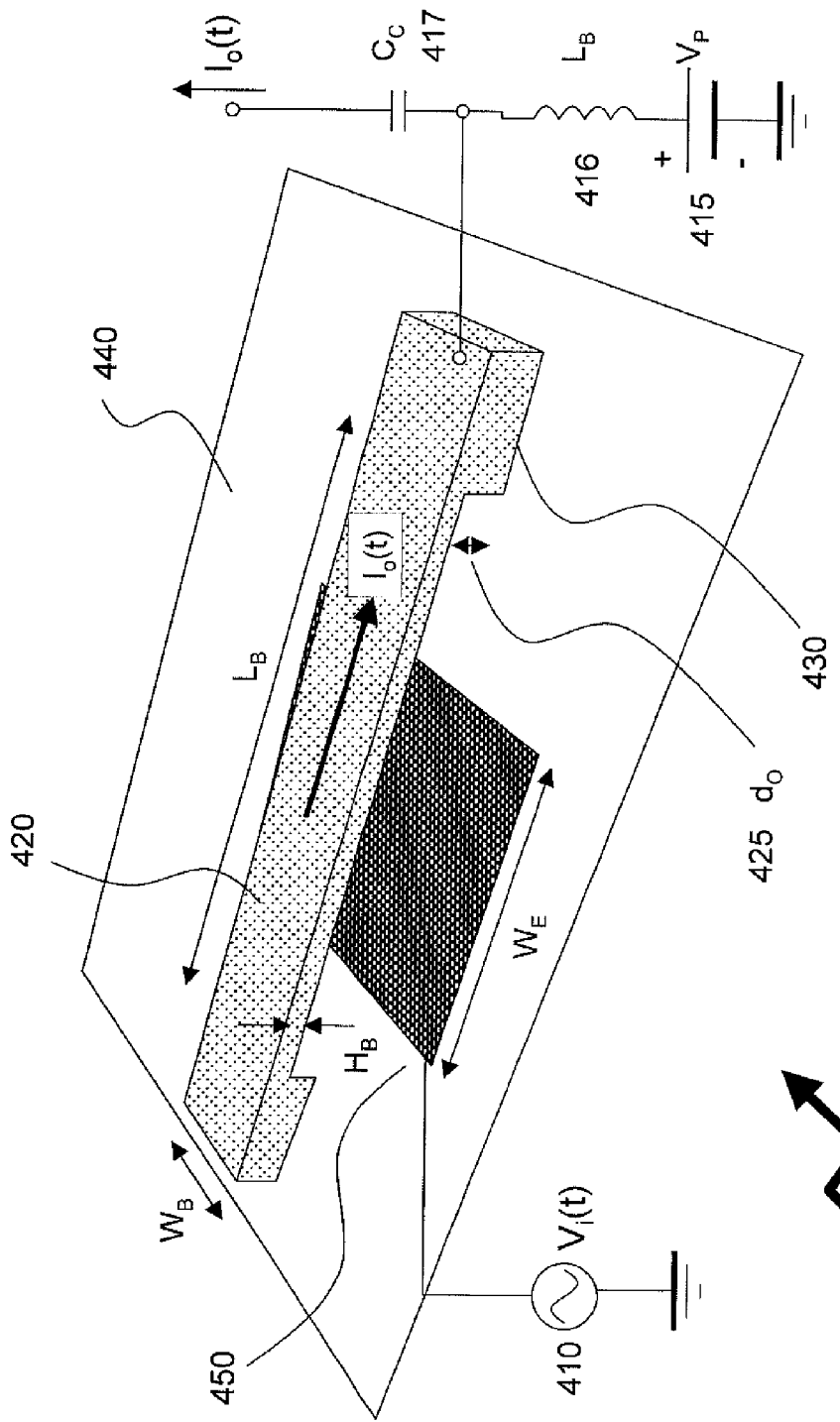
FIG. 4 illustrates an embodiment of the invention to provide a clamped-clamped beam resonator.

FIG. 4 illustrates another embodiment of the invention for providing a microelectromechanical (MEM) clamped-clamped beam resonator 400. Such a clamped-clamped beam resonator 400 allows the integration of RF MEM resonators with CMOS electronics. As would be apparent to one skilled in the art such devices also place particular requirements on the electrical and mechanical performance of MEMS processes and particularly benefit from the integration of the RF MEM resonator directly with analog and digital CMOS electronics. For example, in wireless communications, micromechanical resonators are attractive components to use as intermediate frequency (IF) or image rejection filters as well as in frequency references. Current frequency references make use of quartz crystals which cannot be integrated with CMOS and are, therefore, associated with high costs. MEM resonators fabricated in accordance with an embodiment of the invention could replace these quartz crystals as resonant elements, and simultaneously enable a low-cost and fully-integrated solution via their implementation on silicon CMOS circuits.

As resonant devices, MEM resonators have a transmission characteristic which is tuned to a specific excitation frequency. In RF applications, these resonant structures are usually electro-statically actuated, and hence exhibit an electrical transfer function analogous to that of a highly selective band pass filter. As signal processors, these benefit from integration in communication systems where bulky and costly off-chip high-quality filters are replaceable by MEM resonators that can be fully integrated to the underlying electronics. MEM resonators, are also a significant enabling element of many sensing applications including, gas, vibration, ultrasound, chemical, and biological sensing. Biomedical applications extend into domains such as artificial cochlear implants. This large spread of applications makes resonators a critical building block candidate of any CMOS compatible MEMS process. MEM resonators are based on structures' mechanical resonant modes, related to the material properties of the MEMS structural materials, and therefore benefit from high Young's modulus and low density as outlined in respect of FIG. 1, and are subject to few energy loss mechanisms that enable these devices to resonate with very high Q-factors.

The clamped-clamped beam resonator 400 is shown implemented onto a silicon substrate 440 within which CMOS electronics would be implemented (not shown for clarity) to utilize the resonant electrical behavior of the clamped-clamped beam resonator 400. The resonant beam 420 being mounted by landings 430 having an electrode 450 positioned beneath. The clamped-clamped beam resonator 400 is based upon capacitive transduction. As such a signal input $v_i(t)$ from source 410 and a DC voltage $V_P$ 415 via AC blocking inductor 416 are applied between the resonant beam 420 and the electrode 450. These bias and input voltages are effectively applied across the capacitor formed by the resonant beam 420 and the electrode 450 across the gap $d_o$ 425 creating an electrostatic force, which is balanced by the spring force of the beam. Once in resonance, the resonator sources an output current via the capacitor 417:

$$i_o \cong \frac{\varepsilon_o W_E W_B}{d_0^2} \frac{\delta x}{\delta t} V_p \quad (3)$$

where x represents the resonator beam's 420 displacement, $\varepsilon_0$ the permittivity constant, $W_B$ the width of the beam, $W_E$ the width of the electrode 450, and the gap $d_o$ 425 between the electrode 450 and lower surface of the resonant beam 420. As for the resonant frequency of the beam, it is defined by its shape and composition. In the case of a clamped-clamped beam resonator 400, neglecting the electrical spring force, the mechanical resonant frequency $f_o$ can be expressed as:

$$f_o = \frac{1}{2\pi} 2 \sqrt{\frac{k_r}{m_r}} \cong 1.03 \sqrt{\frac{E}{\rho}} \frac{H_B}{L_B^2} \quad (4)$$

where $H_B$ defines the beam thickness, $L_B$ the beam length, E the beam's material Young's modulus and $\rho$ it's density. This equation motivates the use of high acoustic materials such as SiC for high frequency operation of MEM resonators.

As described below in respect of FIG. 5 and supra in respect of the resonator beam 420 of FIG. 4 for a MEMS compatible process onto a Si CMOS device an important aspect relates to the method of forming the structural material through consideration of
- intrinsic stress control for low stress films to prevent structural buckling or fracture,
- ability for small (<200 nm) gap to allow for effective electrostatic coupling,
- CMOS-compatible deposition temperature, and
- low-cost deposition technology that allows for manufacturability.

Based upon material selection chart 100 it is evident that SiC, $Al_2O_3$ (alumina), diamond, and potentially $Si_3N_4$ (silicon nitride) offer enhanced MEMS performance to prior art silicon. In considering SiC, a critical aspect of the implementation of MEMS devices is the deposition of the core structural SiC layers. Within the prior art SiC has been traditionally deposited using one of four different methods:
1) low-pressure chemical vapor deposition (LPCVD);
2) atmospheric pressure chemical vapor deposition (APCVD);

3) plasma-enhanced chemical vapor deposition (PECVD); and 4) magnetron enhanced sputtering.

Both LPCVD and APCVD have been used to successfully deposit SiC films; however, these reactions are usually highly endothermic and yield poor stress control, hence requiring deposition temperatures typically of 800° C. to 1300° C. As a result of these high temperatures, no method to date has allowed for post-CMOS integration using APCVD or LPCVD of SiC. Furthermore, the deposition rate is typically very low since the overall reaction is limited by the surface reaction rate.

PECVD which uses RF-induced plasma to transfer energy to the reactant gases allows the substrate to remain at a much lower temperature. Using this technique, low temperature deposition is possible. The composition of SiC deposited at these relatively low temperatures is amorphous or polycrystalline with crystal grains present in more quantity when the deposition temperature is increased. Residual stresses in deposited films, however, are typically very high, and therefore a CMOS incompatible post-deposition high temperature anneal is required.

It has now been found that by exploiting DC magnetron enhanced sputtering not only can the processing be performed at room temperature, but that this can yield good stress control and no special CVD processes are required when forming structural layers in MEMS. DC sputtering is also useful for metal depositions for upper and lower metallizations to the ceramic layer demonstrating a significant reduction in the amount and cost of equipment to implement the process, and render it less hardware dependant for enhanced manufacturability. Sputtering is typically performed by bombarding a SiC target with positive argon ions created in a plasma. These incident ions sputter away material by physical momentum transfer, which then condenses onto the substrate. Since this is a purely physical process, no external heat source is required and the process is performable at room temperature; however, the substrate temperature rises marginally due to bombardment by secondary electrons, and neutral atoms. As a result according to embodiments of the invention the maximum temperature of the substrate as measured is limited to below 200° C., which is considerably lower that most CVD processes, and can be reduced further at the cost of lower throughput if thermal relief pauses are taken during deposition. Another advantage of physical sputtering is that deposited films are conformal and adhere well to the substrate. It has a relatively high deposition rate, and residual stresses are nearly avoidable by careful selection of the process parameters.

Further, the embodiments of the invention provide for a low temperature MEMS structural deposition process that is relatively simple, low-cost, and can be performed using only argon gas and a sintered SiC target. The SiC from the process is amorphous, has isotropic material properties, maintains its high elastic modulus, hardness and inertness but is non-conductive thereby allowing the isolation of electrical contacts on one surface or between top and bottom surfaces as discussed supra in respect of FIGS. 2 and 3. According to embodiments of the invention, the interconnects are metal-based in order to maintain low thermal loading to the Si CMOS circuits. This has the added benefit of lower resistance interconnects as metal conductivities are orders of magnitude better than doped semi-conductors and achieves low resistive energy losses that improves quality factor performance of devices such as MEMS variable capacitors, switches, inductors or resonators. Alternatively, in other embodiments having reduced thermal constraints doping is employed to provide interconnects to the SiC structural elements.

Figure 5B:
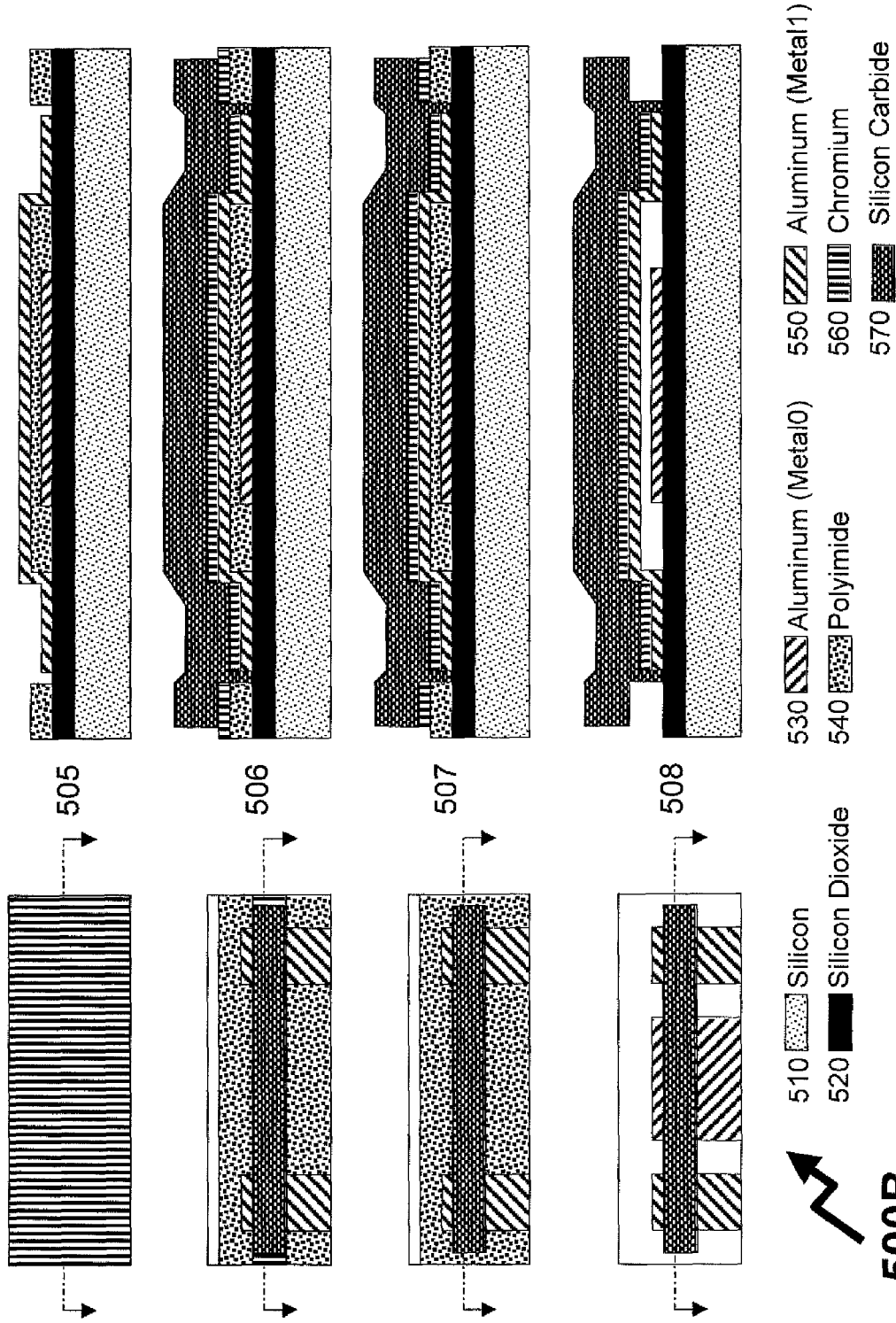

Accordingly, a manufacturing process flow is presented in respect of FIGS. 5A and 5B, illustrating an embodiment of the invention for providing MEMS SiC on Si CMOS. Referring to FIG. 5A the initial process steps are shown in plan and cross-sectional views 500A. In first step 501 the silicon wafer 510 is coated with a 2.5 μm layer of silicon dioxide 520 to reduce electrical feed-through from the electrical interconnects of the MEMS structure to the Si CMOS within the silicon wafer 510. This layer can be removed in another embodiment of the invention when applied directly onto a processed CMOS substrate's passivation or planarization layer such as phosphosilicate glass, silicon oxide, or nitride. In the second step 502 interconnect/ground metallization is formed onto the upper surface of the 2.5 μm layer of silicon dioxide 520 by depositing 60 nm of aluminum (Metal 0) 530 and wet etching to form the electrical pattern required.

Next in the third step 503 a 0.2 μm polyimide layer 540 is deposited and patterned. The 0.2 μm polyimide layer 540 is sacrificial to release the MEMS resonator as finally formed. On top of the sacrificial polyimide layer 540 further 60 nm aluminum layer (metal 1) 550 is deposited and patterned in step 504. The 60 nm aluminum layer (metal 1) 550 forming the lower side metallization of the MEMS structure, in this case the beam interconnect layer.

Now referring to FIG. 5B the final process steps are shown in plan and cross-sectional views 500B. Next at step 505 an 80 nm SiC etch-stop blanket layer of chromium layer 560 is deposited across the surface of the wafer. Next in step 506 a 2 μm SiC MEMS structural layer 570 is deposited and patterned using reactive ion etching in a $NF_3$ environment. At this point an aluminum layer for pad creation or interconnect resistance reduction can be patterned. Next in step 507 the exposed chromium layer 560 is etched using a conventional wet etchant. Finally in step 508 the polyimide sacrificial layer 540 is removed from the wafer using a dry oxygen plasma process. The result in the embodiment described is to release the beam in this example of the MEM resonator. The release etch also removes any remaining exposed chromium layer 560 from under the SiC MEMS structural layer 570 where no aluminum layer (metal 1) 550 is patterned.

It will be evident that the exemplary embodiment presented in respect of FIGS. 5A and 5B provides for three metal layers for routing signal and actuation voltages, one being the aluminum (metal 0) 530 direct to the Si CMOS substrate surface, the second being aluminum (metal 1) 550 on the underside of the SiC MEMS structural layer 570, and the third being a metal 2 layer formed onto the upper surface of the SiC MEMS structural layer 570, such a metal 2 layer not shown within the embodiment presented.

Further the exemplary embodiment presented in respect of FIGS. 5A and 5B being a MEMS resonator is just one possible application of the process where flexibility of three metal layers and SiC MEMS structural layer exist. Optionally the aluminum is replaced with tungsten or other electrical interconnect materials in dependence upon the environmental and chemical aspects of the environment within which the MEMS device is intended to operate.

Optionally, if desired, a 0.2 μm aluminum layer 710 is added to the process flow to serve as the structural layer's 730 top interconnect. This layer is optionally patterned after the SiC patterning or, if the entire top of the SiC is metalized, it can be self-aligned to the SiC layer by patterning it after the chromium mask 720 such that a two-layer mask comprising of aluminum layer 710 and chromium mask 720 masks the SiC 730.

It will be apparent that the provision of electrical interconnections and structures on the lower side of the MEMS structural layer is a particularly novel and beneficial aspect of the invention that is not present in prior art MEMS processes. Optionally, the approach benefits any non-conductive structural layer. Alternatively, the metallization-structural layer-metallization structure is expanded to other combinations and multiple repetitions of the sandwich structure provided the upper temperature limits of the Si CMOS compatible process are not exceeded. Accordingly, the flexibility to provide full metal—structural layer—metal sandwich structures together with the partial variants of lower metal—structural layer and structural layer—upper metal, allows a full scope of the Si CMOS compatible MEMS processes to be exploited in providing a variety of MEMS devices including but not limited to RE switches with signal isolation, tunable inductors, tunable capacitors, RF resonators and tuned RF resonators.

In the following sections aspects of the exemplary embodiments are discussed in respect of aspects of the SiC MEMS layer.

Deposition: The SiC MEMS structural layer 570 according to experimentation for embodiments of the invention was deposited using DC magnetron enhanced sputtering at a range of powers from 300 W to 2000 W and under varying chamber pressures of 3 mTorr to 25 mTorr. An exemplary deposition process, resulting film thickness, and resultant film stress are outlined below in respect of Table 1. It would be apparent to one skilled in the art that other deposition regimes for DC magnetron sputtering exist without departing from the scope of the invention for low temperature deposition of SiC. Typical deposition rates are 75 nm/min from these DC magnetron conditions. Optionally, other deposition techniques are employed without departing from the scope of the invention provided their maximum substrate temperature does not exceed 400° C., and preferably remains below 300° C.

TABLE 1

Exemplary Deposition Process for SiC Structural Layer

| Process Parameter | Value |
|---|---|
| Power (kW) | 2 |
| Pressure (mTorr) | 6 |
| Scan Speed (cm/min) | 5 |
| Scans | 9 |
| Tensile Stress (MPa) | 20 |
| Thickness (μm) | 2 |

Figure 6:
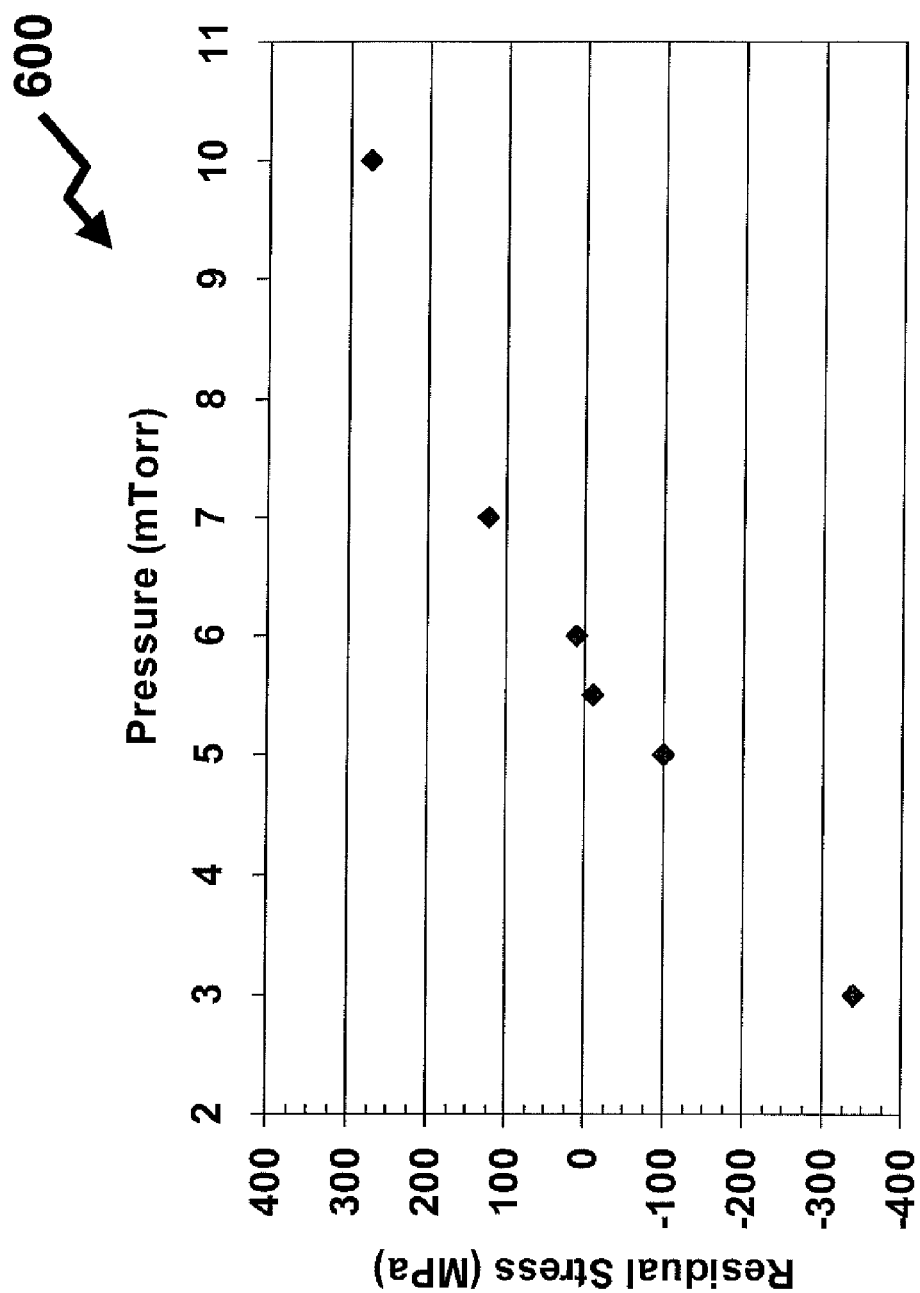
FIG. 6 illustrates the controlled stress deposition of thick SiC MEMS structural layers.

Referring to FIG. 6, the residual stress from SiC MEMS structural layer 570 deposition is presented as a function of chamber base pressure during DC magnetron sputtering. The approach allows reproducible deposition of thick SiC films with residual stress below ±50 MPa. Alternatively, the process provides for the controlled adjustment of stress from tensile through to compressive allowing formation of low temperature silicon carbide devices with designed stress requirements for the SiC MEMS structural layer 570 or matching stress properties of upper layers of the electronic device materials onto which the SiC MEMS structural layer 570 is to be fabricated.

Etching: In general, patterning of SiC MEMS structural layer 570 is much more difficult than other commonly used semi-conducting materials because of its low reactivity. Due to the strong inter-atomic bond of the silicon and carbon atoms (1.34 times stronger than a Si—Si bond), etching using aqueous solutions was performed at temperatures greater than 600° C., which makes wet etching impractical for a low-temperature process. As a result, patterning according to embodiments of the invention for the SiC MEMS structural layer 570 is undertaken using dry processing techniques such as reactive-ion-etching and lift-off. Using lift-off is an attractive method since it can be used to pattern any type of material. In this technique, SiC is first non-conformally deposited over a high-aspect ratio pre-formed mold. Next, the temporary mold is then removed using a wet etch, which lifts-off the unwanted SiC and leaves the patterned structure behind. Even though this method yields good results, it is still quite involved and necessitates the use of multiple steps and sacrificial materials.

Accordingly, dry plasma-based techniques such as reactive ion etching (RIE) provide the simplest known technique to pattern the SiC MEMS structural layer 570. The rate of the overall etch process is dependant on many factors which include pressure, RF power, gas flow rate, DC bias, cathode temperature, and gas chemistry. These parameters can be approximately optimized to obtain highly anisotropic etch profiles for SiC and sustain high etch rates, >2000 Å/min. To increase the etch rate further, the RIE chamber is optionally magnetically enhanced (ME).

Mask: In order to etch the SiC MEMS structural layer a mask is provided onto the upper surface. Since in experiments performed, the etch within the RIE was $NH_3$ based the lower tendency of chromium to form involatile etch products with fluorine was exploited in establishing a novel two-layer metallic mask for the etching of the SiC MEMS structural layer. As shown in FIG. 7, the masking structure 700 is formed after the SiC structural layer 730 and comprises a 2000 Å layer of aluminum 710 which is followed by a 5000 Å layer of chromium 720. According to an embodiment of the invention the chromium 720 is first patterned with a conventional wet-etch, for example Cyantek Cr-14, which then forms the RIE etch mask for the SiC MEMS structural layer. The structure is then wet etched using Phosphoric-Acetic-Nitric acids (PAN), which does not attack chromium 720 but etches away the aluminum 710. By timing this process appropriately, the aluminum can be over-etched to provide a slight undercut 740 beneath the chromium 720, thereby preventing aluminum 710 sputtering during the RIE etch, thereby improving the sidewall quality while still yielding an aluminum top metallization.

The masking process described supra for masking the SiC exploits chromium to reduce micro-masking effect, and thus reduce post-etch residue. Alternatively, an aluminum top conductive layer alone is employed as mask where such micro-masking effects are not critical limits to the MEMS performance. The novel bi-layer mask of chromium and aluminum to pattern the SiC allows the low temperature MEMS process to mitigate micro-masking effects whilst patterning both the SiC and the top interconnect in one process step. The bi-layer mask of chromium-aluminum is optionally replaced with another two metal material combination to create the top electrical interconnect and etch the structural layer provided it meets the provided requirements of deposition temperature, process compatibility, etch resilience, etch rate and etch quality. It would be apparent to one skilled in the art that the bi-layer mask provides enhanced cost benefits in the low temperature Si CMOS compatible MEMS process.

Etch Stop: For optimal manufacturability, the etching of thick, inert SiC MEMS structural layers requires the inclusion of an etch-stop into the mechanical stack of materials of the process structure according to embodiments of the invention.

Table 2 below presents the etch rates under typical RIE process parameters for the material discussed with respect to the embodiments of the invention, namely SiC 730, aluminum 710, and chromium 720.

TABLE 2

Exemplary Etching Process and Etch Rates for Key Materials

| Process Parameter | Value |
| --- | --- |
| Etch Gas | $NF_3$ |
| Gas Flow Rate (sccm) | 15 |
| RF Power (W) | 400 |
| Pressure (mTorr) | 6 |
| Magnetic Field (G) | 65 |
| SiC Etch Rate (Å/min) | ~2075 |
| Al Etch Rate (Å/min) | ~425 |
| Cr Etch Rate (Å/min) | ~200 |

Accordingly, 800 Å being typical of the etch stop employed as chromium layer 560 within FIG. 5B. It should be evident that the use of a metal layer under the structural layer as an etch stop is part of the novel low temperature Si CMOS compatible MEMS process according to embodiments of the invention, and as such is an integral part of the process which is possible because the process is low temperature. One of the main difficulties when using SiC, is the lack of a robust etch stop in most processes; for example, the etch rate of SiC when using RIE is usually about the same order of magnitude as for silicon oxide, silicon nitride and poly-silicon. Thus, the etch rate is optimally tightly controlled in order to prevent damage to underlying layers. This allows a more uniform and repeatable etch, and the protection of the underlying sacrificial layer and bottom interconnect layer to subsequent etches. Also importantly, it allows for the subsequent release of free elements of the MEMS without polyimide fluorination problems caused by the $NF_3SiC$ etch.

Sacrificial Layer: The sacrificial material is used to create the gap between the SiC MEMS structural layer and actuation electrodes or structures on the typically Si CMOS substrate. Since different types of RF MEMS devices have different requirements, the thickness of this layer should be easily adjusted; for example, RF MEMS resonators such as clamped-clamped beam resonator 400 of FIG. 4 have a very tightly-controlled thin gap on the order of 100 nm ($d_o$), while inductors such as MEMS-CMOS inductor 200 typically have a large gap (>5 µm) to reduce coupling to the substrate. Thus, the deposition rate is optimally accurately controlled, while still being relatively large to reduce processing time. Secondly, this layer preferably is easily removed using isotropic etching techniques that do not adversely affect the other materials in the device. Wet etchants are commonly used to release most MEMS devices as they are cost effective and multiple wafers are easily batch processed.

However, a main drawback of wet etching the sacrificial layer is that capillary forces can pull free-standing structures down to the substrate after the wafer is dried. This effect, called stiction, can render a large portion of devices inoperable. Another more attractive release method is to use a dry plasma based etch. Since the etch takes place in a vacuum, no special rinsing and drying procedures to prevent stiction are required after release. In both cases, however, the release step is highly selective to the sacrificial material and thus, in the above embodiments should not etch either aluminum or silicon carbide. SiC does not etch easily in aqueous solutions and is relatively inert, however, aluminum is readily etched by many commonly used release etchants such has hydrofluoric acid (HF). Also, since this process is intended for integration with CMOS, ideally the etchant should be what is termed 'oxide compatible' to ensure that the underlying electronics are not damaged by the release step. As such, the etchant should not attack common CMOS passivation or planarization layers such as phosphosilicate glass, silicon oxide, or nitride.

For embodiments of the invention described supra the sacrificial layer is polyimide. Polyimides are special types of polymers that have both excellent chemical resistance and thermal stability. Usually deposited in a spin coating process, the initial solution is composed of a high-molecular weight, polyamic acid precursor dissolved in an N-methyl-2-pyrrolidone (NMP) solvent system. The spun film is then cured at elevated temperatures, which evaporates any remaining solvent and converts the polyamic acid into its insoluble and chemically resistant form. After imidization is complete, these films are mechanically tough and can withstand a number of common solvents and acids, including acetone, isopropyl alcohol, PAN, and CR-14. Thus, this material is suitable for the process described with reference to embodiments that contain both aluminum and chromium layers. When used as a sacrificial material, it has many advantages. First, since it is deposited in a spin coating process, the deposition temperature is only limited by the curing step, which can be as low as 200° C. This makes it suitable for a low-temperature, CMOS-compatible MEMS fabrication processes according to embodiments of the invention. Second, polyimide films are readily etched in oxygen plasma and thus, devices can be released in a completely dry process which eliminates the need for complex drying procedures. Lastly, the thickness of the layer is adjustable from a few microns all the way down to 100 nm by diluting with an appropriate solvent and by changing the spin speed. This allows for great design flexibility in respect of the different types of RF MEMS devices requiring different gap sizes.

Of note, the surrounding environment of a MEMS device can be hostile because of its corrosive or abrasive nature. In order to protect an IC from hostile environmental influences DC sputtering of an SiC film is optionally used as a coating. Because of its inertness and superior mechanical properties, it improves chemical inertness in corrosive or reactive environments. Further, it enhances mechanical resistance in abrasive environments. Because of the low-temperature deposition described here, the film can be deposited to cover any MEMS device or integrated circuit (e.g. CMOS), or it can be deposited as an encapsulation layer to protect packages or wafer-level packaged dies.

In an embodiment, a MEMS device or an integrated circuit present in an oceanographic micro-sensor is coated with SiC, which improves resistance of the device and the passivation layer of the circuit in the presence of salt water. In another embodiment, a gas sensor present in the exhaust of an engine has its circuitry coated with SiC to withstand the corrosive agents found in exhaust emissions. In yet another embodiment, the membrane of a pressure sensor is coated with SiC to improve its mechanical resilience, or atomic force microscopy (AFM) cantilevers are coated with SiC to improve both their chemical inertness and mechanical properties.

MEMS sensors are being considered for in vivo operation in the human body. In this case, the bio-compatibility of these sensors is often considered paramount. The inherent biocompatibility of SiC allows for MEMS devices, integrated circuits or packages to be coated with it, in order to be inserted safely into the human body as part of a bio-sensing application.

Whilst the embodiments described hereinabove in respect of the low temperature CMOS compatible MEMS process have been described with respect to one materials system, SiC, and metallization it would be apparent that the invention relates to the provision of low temperature MEMS structural layers for CMOS integration with multiple levels of electrical interconnect, structural layers and isolated electrical interconnects.

Whilst the embodiments are described with respect to DC magnetron sputtering of SiC, optionally the SiC is deposited by another sputtering process providing low maximum substrate temperatures. Optionally, SiC is replaced by another ceramic structural layer, for example silicon, silicon dioxide, and silicon nitride. Similarly whilst the electrical interconnections have been described in respect of aluminum other metallization is implemented according to the set forth conductivity specifications, resistance, environment, chemical resilience etc. Such alternative metallization including, but not limited to, gold, titanium, tungsten, silver, copper, and alloys thereof.

The sacrificial material whilst described in respect of polyimide is alternatively another material that is suited to low-temperature spin-on or sputtered deposition techniques with appropriate sacrificial layer processing and ability to form the necessary requirements of the MEMS in respect of the thinness of the gap. Alternatives include sputtered, chromium, silicon, silicon dioxide, indium tin oxide (ITO), spin-on glasses, PMNA or any organic compounds that could be used in the process at low temperatures.

Numerous other embodiments may be envisaged without departing from the spirit or scope of the invention.

What is claimed is:

1. A method comprising:
   providing a substrate; and,
   performing a plurality of manufacturing steps comprising at least providing material onto the substrate and removing material therefrom, the plurality of manufacturing steps resulting in a MEMS structure being formed on the substrate, each of the plurality of steps performed with the substrate at a temperature sufficiently low so as to other than substantially adversely affect electronic circuitry formed within the substrate,
   wherein the plurality of manufacturing steps comprise: providing at least a two layer etch mask for at least a structural layer of the MEMS structure.

2. A method comprising:
   (a) providing a substrate comprising electronic components at least partially within the substrate;
   (b) providing at least one lower metallization;
   (c) providing at least a sacrificial layer;
   (d) providing at least one middle metallization;
   (e) providing a structural layer;
   (f) providing at least one upper metallization; and
   (g) removing the at least one sacrificial layer,
   wherein at least one of (b) and (d) results in the formation of an etch-stop layer for use in a process of etching of the structural layer.

3. A method comprising:
   (a) providing a substrate comprising electronic components at least partially within the substrate;
   (b) providing at least one lower metallization;
   (c) providing at least a sacrificial layer;
   (d) providing at least one middle metallization;
   (e) providing a structural layer;
   (f) providing at least one upper metallization; and
   (g) removing the at least one sacrificial layer,
   wherein (f) results in the formation of an etch-mask for the structural layer, the etch-mask comprising at least two upper metallizations.

4. A method comprising:
   providing a substrate comprising electronic circuitry formed therein; and
   performing a plurality of manufacturing steps comprising at least providing material onto the substrate and removing material therefrom, the plurality of manufacturing steps resulting in a MEMS structure comprising silicon carbide being formed on top of the substrate and above the electronic circuitry, each of the plurality of steps performed with the substrate at a temperature sufficiently low so as to other than substantially adversely affect electronic circuitry formed within the substrate,
   wherein the plurality of manufacturing steps comprises:
   providing an etch stop layer onto the substrate, the etch stop layer comprising material which is incompatible with other than low temperature manufacturing processes; and
   providing silicon carbide onto the substrate above the etch stop layer,
   wherein the MEMS structure comprises at least a portion of the silicon carbide.

5. A method comprising:
   providing a substrate comprising electronic circuitry formed therein; and
   performing a plurality of manufacturing steps comprising at least providing material onto the substrate and removing material therefrom, the plurality of manufacturing steps resulting in a MEMS structure comprising silicon carbide being formed on top of the substrate and above the electronic circuitry, each of the plurality of steps performed with the substrate at a temperature sufficiently low so as to other than substantially adversely affect electronic circuitry formed within the substrate,
   wherein the MEMS structure comprises at least one layer of metallization to a silicon carbide structural layer comprising a predetermined portion of the MEMS structure wherein the at least one layer of metallization comprises:
   metallization of at least one of an upper surface of the substrate, a surface of the silicon carbide structural layer disposed between the silicon carbide structural layer and the substrate, a surface of the silicon carbide structural layer, and a distal surface of the silicon carbide structural layer with respect to the substrate.

6. A method comprising:
   providing a substrate comprising electronic circuitry formed therein; and
   performing a plurality of manufacturing steps comprising at least providing material onto the substrate and removing material therefrom, the plurality of manufacturing steps resulting in a MEMS structure comprising silicon carbide being formed on top of the substrate and above the electronic circuitry, each of the plurality of steps performed with the substrate at a temperature sufficiently low so as to other than substantially adversely affect electronic circuitry formed within the substrate,
   wherein the plurality of manufacturing steps comprise: providing at least a two layer etch mask for at least a silicon carbide structural layer of the MEMS structure.

7. A method comprising:
   providing a substrate comprising electronic circuitry form and
   performing a plurality of manufacturing steps comprising at least providing material onto the substrate and removing material therefrom, the plurality of manufacturing steps resulting in a MEMS structure comprising silicon carbide being formed on top of the substrate and above the electronic circuitry, each of the plurality of steps performed with the substrate at a temperature sufficiently low so as to other than substantially adversely affect electronic circuitry formed within the substrate, wherein the plurality of manufacturing steps comprise: providing a non-conductive silicon carbide structural layer of the MEMS structure, the non-conductive silicon carbide structural layer supporting isolation of electrical contacts formed on the non-conductive silicon carbide structural layer.

8. A method comprising:
providing a substrate; and,
performing a plurality of manufacturing steps comprising:
providing an etch stop layer on the substrate, the etch stop layer comprising material incompatible with other than low temperature manufacturing processes;
providing silicon carbide onto the substrate above the etch stop layer; and
removing material from the substrate;
the plurality of manufacturing steps resulting in a MEMS structure comprising at least a portion of the silicon carbide being formed on top of the substrate, each of the plurality of steps performed with the substrate at a temperature sufficiently low so as to other than substantially adversely thermally affect the etch stop layer.

9. A method according to claim 8 wherein prior to providing silicon carbide, the substrate comprises electronic circuitry formed therein.

10. A method according to claim 9 wherein the electronic circuitry comprises at least a portion of CMOS electronic circuitry.

11. A method according to claim 8 wherein the plurality of manufacturing steps comprises:
depositing a silicon carbide structural layer of the MEMS structure using a sputtering process.

12. A method according to claim 11 wherein the sputtering process comprises magnetron enhanced sputtering.

13. A method according to claim 8 wherein the low temperature manufacturing processes comprise manufacturing processes carried out at or below 250° C.

14. A method according to claim 8 wherein the low temperature manufacturing processes comprise manufacturing processes carried out at or below 350° C.

15. A method according to claim 8 wherein the low temperature manufacturing processes comprise manufacturing processes carried out at or below 400° C.

16. A method according to claim 9 comprising:
electrically coupling a conductive port of the MEMS structure and at least an electronic circuit within the electronic circuitry.

17. A method according to claim 8 wherein the MEMS structure comprises at least one silicon carbide structural layer, and wherein the temperature is sufficiently low such that the substrate remains at or below 350° C. during the plurality of manufacturing steps.

18. A method according to claim 8 wherein the MEMS structure comprises at least one silicon carbide structural layer, and wherein the temperature is sufficiently low such that the substrate remains at or below 250° C. during the plurality of manufacturing steps.

19. A method according to claim 8 wherein the MEMS structure comprises at least one layer of metallization to a silicon carbide structural layer comprising a predetermined portion of the MEMS structure.

20. A method according to claim 19 wherein the at least one layer of metallization comprises:
metallization of at least one of an upper surface of the substrate, a surface of the silicon carbide structural layer disposed between the silicon carbide structural layer and the substrate, a surface of the silicon carbide structural layer, and a distal surface of the silicon carbide structural layer with respect to the substrate.

21. A method according to claim 8 wherein the plurality of manufacturing steps comprises:
providing a sacrificial layer.

22. A method according to claim 8 wherein the plurality of manufacturing steps comprises: providing at least a two layer etch mask for at least a silicon carbide structural layer of the MEMS structure.

23. A method according to claim 8 wherein the plurality of manufacturing steps comprises:
providing a non-conductive silicon carbide structural layer of the MEMS structure, the non-conductive silicon carbide structural layer supporting isolation of electrical contacts formed on the non-conductive silicon carbide structural layer.

* * * * *